United States Patent
Appello et al.

(10) Patent No.: US 10,107,856 B2
(45) Date of Patent: Oct. 23, 2018

(54) APPARATUS FOR THE THERMAL TESTING OF ELECTRONIC DEVICES AND CORRESPONDING METHOD

(71) Applicant: STMicroelectronics S.r.l., Agrate Brianza (IT)

(72) Inventors: Davide Appello, Bussero (IT); Giorgio Pollaccia, Palermo (IT); Antonio Giambartino, Palermo (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 212 days.

(21) Appl. No.: 14/840,568

(22) Filed: Aug. 31, 2015

(65) Prior Publication Data
US 2016/0109509 A1    Apr. 21, 2016

(30) Foreign Application Priority Data
Oct. 21, 2014  (IT) .............................. TO2014A0853

(51) Int. Cl.
*G01R 31/28*          (2006.01)

(52) U.S. Cl.
CPC ..... *G01R 31/2889* (2013.01); *G01R 31/2875* (2013.01)

(58) Field of Classification Search
CPC ............ G01R 31/2874; G01R 31/2889; G01R 31/2875
USPC ..................................................... 324/750.05
See application file for complete search history.

(56) References Cited

U.S. PATENT DOCUMENTS

| | | | |
|---|---|---|---|
| 4,777,434 A * | 10/1988 | Miller | G01R 31/2863 219/209 |
| 5,541,525 A | 7/1996 | Wood et al. | |
| 5,697,795 A | 12/1997 | Abe | |
| 5,748,007 A | 5/1998 | Gaschke | |
| 5,825,171 A | 10/1998 | Shin | |
| 6,218,202 B1 | 4/2001 | Yew et al. | |
| 7,312,621 B2 | 12/2007 | Yamaguchi et al. | |
| 7,318,672 B2 | 1/2008 | Hardcastle, III | |
| 7,514,946 B2 | 4/2009 | Soeta et al. | |
| 8,091,863 B2 | 1/2012 | Komoto et al. | |
| 2004/0196061 A1 | 10/2004 | Hoppe | |
| 2005/0007136 A1* | 1/2005 | Feder | H01L 21/67248 324/750.05 |
| 2006/0186909 A1* | 8/2006 | Aube | G01R 31/2875 324/750.09 |

(Continued)

FOREIGN PATENT DOCUMENTS

| CN | 1225724 A | 8/1999 |
|---|---|---|
| CN | 1449010 | 10/2003 |

(Continued)

*Primary Examiner* — Melissa Koval
*Assistant Examiner* — Courtney McDonnough
(74) *Attorney, Agent, or Firm* — Slater Matsil, LLP

(57) ABSTRACT

An apparatus for the thermal testing of electronic devices may include a universal base board for coupling to an electronic driver unit for receiving electrical signals therefrom, and a plurality of test boards arranged on the base board. Each test board may include a holder for receiving a device under test and routing thereto electrical signals from the electronic driver unit as well as an adaptation board to the base board. Each test board may include a respective electrically powered heating element for heating the electronic device received thereat.

18 Claims, 1 Drawing Sheet

(56) References Cited

U.S. PATENT DOCUMENTS

| | | |
|---|---|---|
| 2006/0290370 A1 | 12/2006 | Lopez |
| 2008/0018353 A1* | 1/2008 | Thamarayoor ...... G01R 1/0483 |
| | | 324/756.02 |
| 2008/0182436 A1* | 7/2008 | Rathburn ........... H01R 13/2414 |
| | | 439/78 |
| 2008/0191707 A1 | 8/2008 | Collins et al. |
| 2010/0164525 A1 | 7/2010 | Han et al. |
| 2015/0204942 A1* | 7/2015 | Scocchetti ....... G01R 31/31905 |
| | | 324/750.05 |

FOREIGN PATENT DOCUMENTS

| | | |
|---|---|---|
| CN | 1841046 A | 10/2006 |
| CN | 1847859 A | 10/2006 |
| CN | 101533762 A | 9/2009 |
| EP | 1925945 A2 | 5/2008 |
| EP | 1925945 A3 | 4/2011 |
| WO | 9743653 A1 | 11/1997 |

* cited by examiner

APPARATUS FOR THE THERMAL TESTING OF ELECTRONIC DEVICES AND CORRESPONDING METHOD

TECHNICAL FIELD

The present description relates to thermal testing of electronic devices, and more particularly, to testing and burn-in of integrated circuits (e.g. MicroController Units or MCUs with embedded flash memories).

BACKGROUND

Burn-in (i.e. a test where an electronic device such as e.g. a circuit, system or component is run for a certain period of time to detect problems) may be mandatory for certain electronic products for the automotive sector. For instance, for MCUs with embedded flash memories, 100% full time burn-in may be a requirement.

Burn-in may be a fairly expensive step, and a test strategy, e.g. a MCU test strategy, may provide that certain elements of the burn-in infrastructure (e.g. the burn-in boards (BIBs), the BIB Loader Unloader (BLU), and possibly the climatic chambers) should be re-usable in order to increase the lifetime of all necessary items. The cost of testing may thus be reduced by applying the flash test (which may be long, e.g. several tens of seconds per unit) on the test step having the highest parallelism.

BIBs may be equipped with integrated circuit (IC) sockets having e.g. a cost in the range of $30-$60 with through-hole mounting (soldered). Such BIBs may exhibit a certain sensitivity to ageing (contact resistance or Cres, mechanical degradation of the plastic frame, springs and contact leads). Also, they may be monolithic, and thus customized for each product/package type.

These BIBs may thus exhibit performance degradation through ageing, due to their being "burned" several times together with the devices (e.g. ICs) undergoing burn-in. This performance degradation may have an impact in terms of yield with false fails and damaged BIB components (sockets, passive), which may not be replaceable due to their being soldered on the printed circuit board (PCB) of the BIB via through holes. A BIB may thus be scrapped once its overall performance level drops below a defined threshold to be replaced with a new one.

Also, conventional BIBs may be customized on a product/package basis, so that non-recurring engineering or effort (NRE) may be desired for each new product, possibly along with debugging and validation of the new hardware (HW) associated therewith. In order to temporarily recover some of the performance level, BIBs may be cleaned using chemicals. These may be unfriendly to the environment, and the associated processing step may have a cost which impacts on the overall cost of ownership (COO).

SUMMARY

One or more embodiments thus have the object of improving over conventional solutions e.g. by increasing yield and reducing cost of ownership. One or more embodiments achieve that object with an apparatus for the thermal testing of electronic devices that includes a base board to be coupled to an electronic driver (ED) unit is for receiving electrical signals therefrom, and a plurality of test boards arranged on the base board. Each test board is configured to receive at least one device under test (DOT) and route thereto electrical signals from the electronic driver unit (ED). Each test board includes a respective electrically powered heating element for heating the at least one device under test.

The electrically powered heating element may include a thin-film resistor. The test boards may be screwed on the base board.

The apparatus may also include elastic elements between the test boards and the base board. The apparatus may also include at least one array of electrical contacts between the test boards and the base board. The at least one array of electrical contacts may include an array of contact pads on the base board and an array of contact pins on the test boards.

The apparatus may also include micro-contacts on the test boards to provide pressure contact with the devices under test. The test boards may include a holder for the at least one device under test, and an adaptation board interfacing the holder with the base board. The contact leads and/or the micro-contacts may be provided on the adaptation board.

A method aspect is directed to a method of thermal testing electronic devices that includes locating electronic devices to be tested at the test boards, and coupling the base board with the electronic driver unit to receive electrical signals therefrom. The method also includes feeding electrical power to the electrically powered heating elements to produce heating of the electronic devices located at the test boards.

One or more embodiments may provide one or more of the following advantages:

- "universal" Burn-In Boards (BIBs) may be developed which may be validated once for a certain package type, with only one NRE, only one validation effort;
- customization for the product may be at an adaptation board level, thus improving the routing and signal integrity in a universal board;
- holders for devices subject to testing ("Devices Under Test" or DUTs) may be held on the test boards by screw holes rather than through hole leads, which results in improved routing of signals;
- any passive elements possibly providing decoupling may be mounted on the opposite side of the DUT holders, which makes it possible to achieve a higher density and improved signal integrity;
- temperature control of the DUTs may be achieved by dispensing with a thin film resistor, which may also entail reduced ageing of the universal board material, due to the reduced exposition to high temperatures; ageing effects may thus be mitigated; and
- adaptation boards may be provided which can be substituted when performance drops below an acceptable level: this may lead to an extension of BIB lifetime and cost savings.

In one or more embodiments cost savings may be significant (e.g. in the range of 30 to 40%) due to two main factors: extended BIB lifetime; and an increased number of working positions on a BIB, also thanks to repair being made possible.

DETAILED DESCRIPTION

In the ensuing description one or more specific details are illustrated, aimed at providing an in-depth understanding of examples of embodiments. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the scope of protection or the scope of the embodiments.

Apparatuses for thermal testing of electronic devices is discussed extensively in the literature, including patent literature. Exemplary of such literature are the following documents: U.S. Pat. No. 5,825,171, which discloses reconfiguration with a matrix of jumpers on the board, U.S. Pat. No. 5,748,007, which is directed to socket size adjustment, while electrical reconfiguration not considered, U.S. Patent Application No. 2006/0290370, which discloses a temperature being controlled by air flows and fans, U.S. Pat. No. 5,697,795, which discloses as requiring through hole and soldering on the target PCB BIB, and U.S. Pat. No. 6,218, 202, which discloses an arrangement for adaptation to different packages which may be complex and likely to become critical in harsh manufacturing environments like burn-in.

Figure 1:
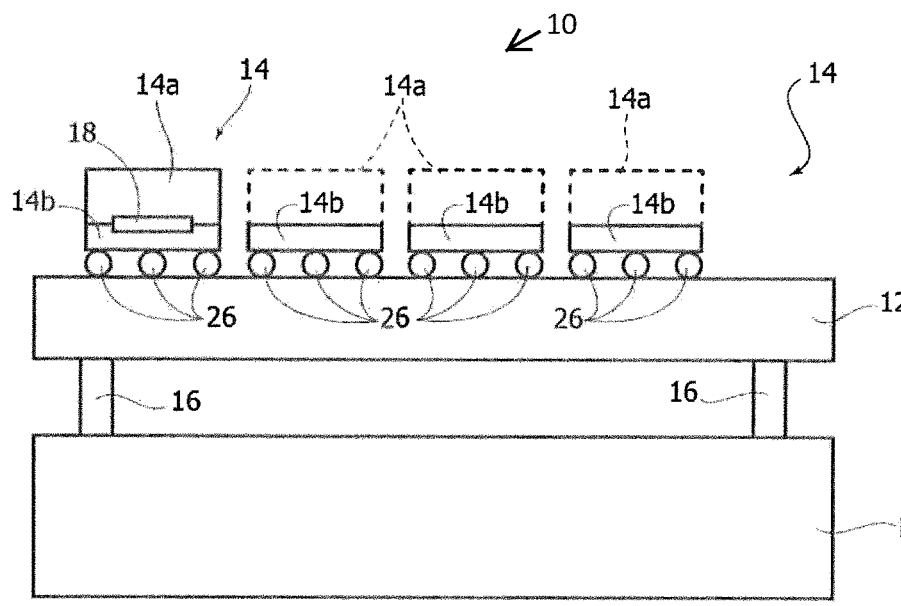
FIG. 1 is a schematic diagram of an apparatus according to one or more embodiments if the present invention.
Figure 2:
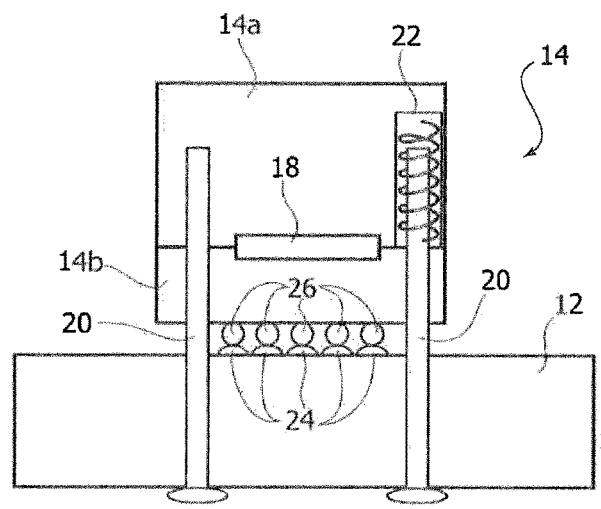
FIGS. 2 and 3 more detailed schematic diagrams of an apparatus according to an embodiment of the present invention.

In FIG. 1, an apparatus for the thermal testing (e.g. testing and burn-in under controlled temperature) of electronic devices is denoted by 10. Integrated circuits (e.g. Micro-Controller Units or MCUs with embedded flash memories) are exemplary of electronic devices adapted to be tested as devices under test or DUTs in apparatus 10.

In one or more embodiments, apparatus 10 may include a "universal" burn-in base board or BIB 12 which may be used for DUTs sharing the same package type, and a plurality of test boards 14 arranged on the base board 12, each adapted to receive at least one DUT.

In one or more embodiments, the test boards 14 may include a holder 14a for the DUT received at the test board and an adaptation board 14b which is used to interface the universal base board 12 with the holder 14a and to route the DUT electrical signal from an electronic driver unit ED to which the base board 12 may be coupled e.g. via a "pogo" assembly 16. The electronic driver unit ED may be of any known type for use in testing electronic devices such as ICs.

In one or more embodiments, a thin-film resistor heater 18 may be exemplary of a heating element adapted to be provided on the DUT side of the adaptation board 14b so that once the DUT is arranged at the test board 14 and held thereat by the holder 14a, the heater 18 lies under the DUT e.g. under the package body of the DUT. Various alternative approaches to a thin film resistor are available to implement such a heating element. Holders 14a may be of any known type for use in holding electronic devices under test or DUTs e.g. on a burn-in board, the characteristics of the devices under test dictating the features (size, shape, holding mechanism, and so on) of such holders.

Figure 3:
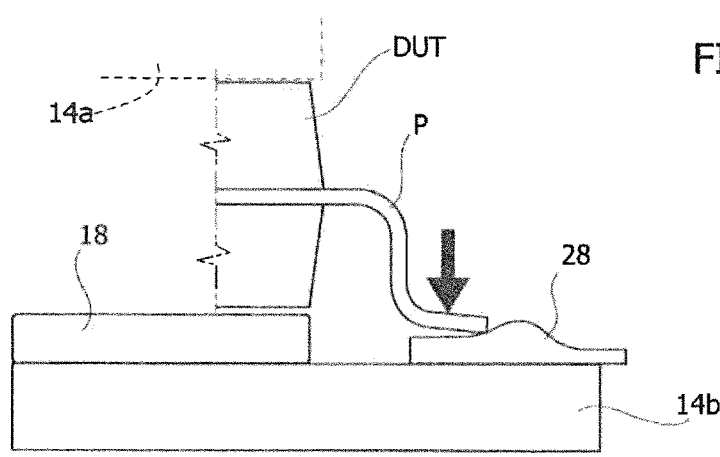

In one or more embodiments as exemplified herein, the holder 14a and the associated adaptation board 14b may part of a test board assembly 14 which is mounted on the base board 12 e.g. via screws 20. The action provided by the screws 20 in retaining the DUTs may be combined with elastic force provided by springs 22 to compensate thermal effects on materials, with the DUTs elastically retained between the spring-loaded holder 14a and the adaptation board 14b (e.g. by being clamped therebetween) as schematically shown in FIG. 3.

Electrical contact between the base board 12 and the test boards 14 (e.g. adaptation boards 14b) may be achieved based upon an array of pads 24 (DUT array) formed on the base board 12 and a mirrored array of contact leads 26 formed on the adaptation boards 14b. In one or more embodiments as exemplified herein (see e.g. FIG. 3) micro-contact elements 28, e.g. soldered on the adaptation boards 14b, may provide mechanical opposition to electrical contact leads (e.g. IC pins P) and compensate mechanical tolerances.

One or more embodiments may thus include a base board 12 that may be coupled to an electronic driver unit ED for receiving electrical signals therefrom, and a plurality of test boards 14 arranged on the base board 12. Each test board may be configured for receiving at least one device under test or DUT and routing thereto electrical signals from the electronic driver unit ED and may include a respective electrically powered heating element 18 for heating the at least one electronic device or DUT received thereat.

The electrically powered heating element 18 may include a thin-film resistor. The test boards 14 may be screwed 20 on the base board. Elastic elements 22 (e.g. helical springs) may be arranged between the test boards 14 and the base board 12 (e.g. by being vested onto the screws 20 fixed on the base board 12 and acting on the holders 14a to retain the DUTs against the adaptation boards 14b).

In one or more embodiments that apparatus may include at least one array of electrical contacts 24, 26 between the test boards 14 and the base board 12. The at least one array of electrical contacts may include an array of contact pads 24 on the base board, and an array of contact leads 26 on the test boards. Micro-contacts 28 may be included on the test boards 14 to provide pressure contact with the electronic devices under test.

The test boards 14 may include a holder 14a for the at least one device under test, and an adaptation board 14b interfacing the holder with the base board. The contact leads 24 and the micro-contacts 28 may be provided on the adaptation board.

A method of thermal testing electronic devices by the apparatus 10 may include locating electronic devices DUT to be tested at the test boards 14, and coupling the base board 12 with the electronic driver unit ED to receive electrical signals (e.g. test signal patterns) therefrom. The method may also include feeding electrical power to the electrically powered heating elements 18 to produce heating of the electronic devices DUT located as the test boards.

One or more embodiments may take advantage of the possibility of resorting to technologies which are already in use in different technical fields. For instance, "universal" BIBs as exemplified herein (integer 12) may be produced by resorting e.g. to manufacturing technologies as used for mother-boards in ATE (Advanced Technology Engine) boards.

Micro-contacts elements 28 as exemplified herein may be produced by resorting e.g. to technologies already used in producing "pogo" or probe card contact tips. In that respect, one or more embodiments may resort to contact approaches admitting relatively relaxed constraints, such as e.g. a temperature range for ambient (AMB) to 125° C. instead of −45° C. to 150° C., and the number of insertions <10K instead of >300K.

Printed circuit board (PCB) contact pads 24 as exemplified herein may be produced by resorting e.g. to technologies already used in producing (NiPdAu) pads which are common in the art technologies, without being exposed to critical constraints in terms of e.g. pitch.

The foregoing also applies to film heaters 18: e.g. flexible heaters are a technology widely used in plural technical fields, with performance assured over several thousand of hours up to 260° C., which may be largely in excess of the conditions applicable to one or more embodiments.

Without prejudice to the underlying principles, the details and embodiments may vary, even significantly, with respect to what is illustrated herein purely by way of non-limiting example, without thereby departing from the extent of protection. The extent of protection is determined by the claims that follow.

The invention claimed is:

1. An apparatus for thermal testing electronic devices comprising:
    a base board to be coupled to an electronic driver unit through a pogo assembly and configured to receive electrical signals therefrom, the base board comprising an universal architecture; and
    a plurality of test boards mounted on said base board, each of said plurality of test boards being configured to receive at least one of the electronic devices under test and route the electrical signals from the electrical driver unit to the at least one electronic device under test, wherein each of said plurality of test boards also including
        a holder for said at least one electronic device under test,
        an adaptation board defining an interface between said holder and said base board, the adaptation board being configured to provide routing and signal integrity to the at least one of the electronic devices, and
        a respective electrically powered heating element for heating the at least one electronic device under test received thereat, the electrically powered heating element disposed between the adaptation board and the at least one electronic device under test,
        wherein each of said plurality of test boards is detachably attached to the base board using a plurality of screws.

2. The apparatus of claim 1, wherein said electrically powered heating element comprises a thin-film resistor.

3. The apparatus of claim 1, wherein said plurality of test boards are fastened to said base board.

4. The apparatus of claim 1, further comprising a plurality of elastic elements between said plurality of test boards and said base board.

5. The apparatus of claim 1, further comprising at least one array of electrical contacts between said plurality of test boards and said base board.

6. The apparatus of claim 5, wherein said at least one array of electrical contacts comprises:
    an array of contact pads carried by said base board; and
    an array of contact balls carried by said plurality of test boards.

7. The apparatus of claim 1, further comprising microcontacts carried by said plurality of test boards, said microcontacts being configured to provide pressure contact with said at least one electronic device under test.

8. The apparatus of claim 1, further comprising a plurality of contacts carried by said adaptation board.

9. A thermal testing apparatus comprising:
    a base board comprising an universal architecture; and
    a plurality of test boards carried by said base board, each of said plurality of test boards being configured to receive at least one device under test and permit communication between an electrical driver unit through a pogo assembly and the at least one device under test, each of said plurality of test boards also including
        a holder for said at least one device under test,
        an adaptation board defining an interface between said holder and said base board, and
        a respective electrically powered heating element for heating the at least one device under test, the electrically powered heating element disposed between the adaptation board and the at least one device under test;
    an array of pads disposed on the base board under each of the plurality of test boards; and
    an array of contact leads disposed on each of the plurality of test boards, the array of contact leads coupling a corresponding pad of the array of pads.

10. The apparatus of claim 9, wherein said electrically powered heating element comprises a thin-film resistor.

11. The apparatus of claim 9, further comprising a fastener coupling said plurality of test boards to said base board.

12. The apparatus of claim 9, further comprising a plurality of elastic elements between said plurality of test boards and said base board.

13. A method of thermal testing electronic devices, the method comprising:
    detachably attaching a base board with an electrical driver unit through a pogo assembly, the base board comprising an universal architecture;
    detachably attaching each of a plurality of test boards to a base board using a plurality of screws, each of the plurality of test boards being configured to receive a respective one of the electronic devices to be thermally tested, and each of the plurality of test boards also including
        a holder for holding one of the electronic devices to be thermally tested,
        an adaptation board defining an interface between said holder and said base board, and
        a respective electrically powered heating element, the electrically powered heating element disposed between the adaptation board and the one of the electronic devices to be thermally tested;
    locating the electronic devices to be tested at the test boards;
    coupling the base board to an the electronic driver unit to receive electrical signals therefrom and route the electrical signals to the electronic devices; and
    feeding electrical power to the electrically powered heating elements to heat the electronic devices.

14. The method of claim 13, wherein the electrically powered heating elements each comprises a thin-film resistor.

15. A method of making a thermal testing apparatus comprising:
    forming a plurality of test boards, each of the plurality of test boards for receiving at least one device under test and permitting communication between an electrical driver unit through a pogo assembly and the at least one device under test, forming the plurality of test boards comprising
forming, for each of the plurality of test boards also, a holder for said at least one device under test, an adaptation board, and a respective electrically powered heating element for heating the at least one device under test, the electrically powered heating element disposed between the adaptation board and the at least one device under test;

forming an array of contact leads disposed on each of the plurality of test boards;

providing a base board comprising an array of pads under each of the plurality of test boards, the base board comprising an universal architecture, wherein the adaptation board provides an interface between said holder and said base board; and mechanically coupling the plurality of test boards to a base board, the array of contact leads electrically coupling a corresponding pad of the array of pad.

16. The method of claim 15, wherein forming the respective electrically powered heating element comprises forming a thin-film resistor.

17. The method of claim 15, wherein coupling the plurality of test boards to the base board comprises coupling the plurality of test boards to the base board using a fastener.

18. The method of claim 15, further comprising forming a plurality of elastic elements between the plurality of test boards and the base board.

* * * * *